US009013242B2

United States Patent
Ishii

(10) Patent No.: US 9,013,242 B2
(45) Date of Patent: *Apr. 21, 2015

(54) RESONATOR ELEMENT, RESONATOR, ELECTRONIC DEVICE, ELECTRONIC APPARATUS, AND MOBILE OBJECT

(71) Applicant: Seiko Epson Corporation, Tokyo (JP)

(72) Inventor: Osamu Ishii, Tatsuno-machi (JP)

(73) Assignee: Seiko Epson Corporation (JP)

( * ) Notice: Subject to any disclaimer, the term of this patent is extended or adjusted under 35 U.S.C. 154(b) by 75 days.

This patent is subject to a terminal disclaimer.

(21) Appl. No.: 13/832,565

(22) Filed: Mar. 15, 2013

(65) Prior Publication Data

US 2013/0257553 A1  Oct. 3, 2013

(30) Foreign Application Priority Data

Mar. 27, 2012  (JP) .................. 2012-070896
Feb. 7, 2013  (JP) ................. 2013-022030

(51) Int. Cl.
| | | |
|---|---|---|
| H03B 5/32 | (2006.01) | |
| H01L 41/047 | (2006.01) | |
| H03H 9/17 | (2006.01) | |
| H03H 9/02 | (2006.01) | |

(52) U.S. Cl.
CPC ............. *H01L 41/047* (2013.01); *H03B 5/32* (2013.01); *H03H 9/17* (2013.01); *H03H 9/02102* (2013.01); *H03H 9/177* (2013.01)

(58) Field of Classification Search
USPC .......... 331/154, 158, 107 R, 116 R; 310/365, 310/367
See application file for complete search history.

(56) References Cited

U.S. PATENT DOCUMENTS

| | | | |
|---|---|---|---|
| 7,129,624 B2 | 10/2006 | Umeki et al. | |
| 7,129,799 B2 * | 10/2006 | Sasaki | 331/158 |
| 8,164,235 B2 | 4/2012 | Koyama | |
| 2004/0036383 A1 | 2/2004 | Rubach | |
| 2009/0085428 A1 | 4/2009 | Maeda | |
| 2010/0327705 A1 | 12/2010 | Koyama | |
| 2013/0257554 A1 * | 10/2013 | Ishii et al. | 331/158 |

FOREIGN PATENT DOCUMENTS

| | | |
|---|---|---|
| JP | 07-046072 | 2/1995 |
| JP | 09-246903 A | 9/1997 |
| JP | 11-284484 | 10/1999 |
| JP | 2002-111435 A | 4/2002 |
| JP | 2002-190717 A | 7/2002 |
| JP | 2002-368573 A | 12/2002 |
| JP | 2004-146963 A | 5/2004 |
| JP | 2004-179879 A | 6/2004 |

(Continued)

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

A resonator element includes a substrate including a first principal surface and a second principal surface respectively forming an obverse surface and a reverse surface of the substrate, and vibrating in a thickness-shear vibration mode, a first excitation electrode disposed on the first principal surface, and a second excitation electrode disposed on the second principal surface, and being larger than the first excitation electrode in a plan view, the first excitation electrode is disposed so as to fit into an outer edge of the second excitation electrode in the plan view, and the energy trap conffficient M fulfills $15.5 \leq M \leq 36.7$.

13 Claims, 11 Drawing Sheets

(56) References Cited

FOREIGN PATENT DOCUMENTS

| JP | 2005-203858 | | 7/2005 |
| JP | 2007-158486 | A | 6/2007 |
| JP | 2007-214941 | A | 8/2007 |
| JP | 2009-089441 | A | 4/2009 |
| JP | 2010-074840 | | 4/2010 |
| JP | 2010-193496 | A | 9/2010 |
| JP | 2011-147053 | A | 7/2011 |
| JP | 2011-160094 | A | 8/2011 |
| WO | WO-2009-002022 | A1 | 12/2008 |

* cited by examiner

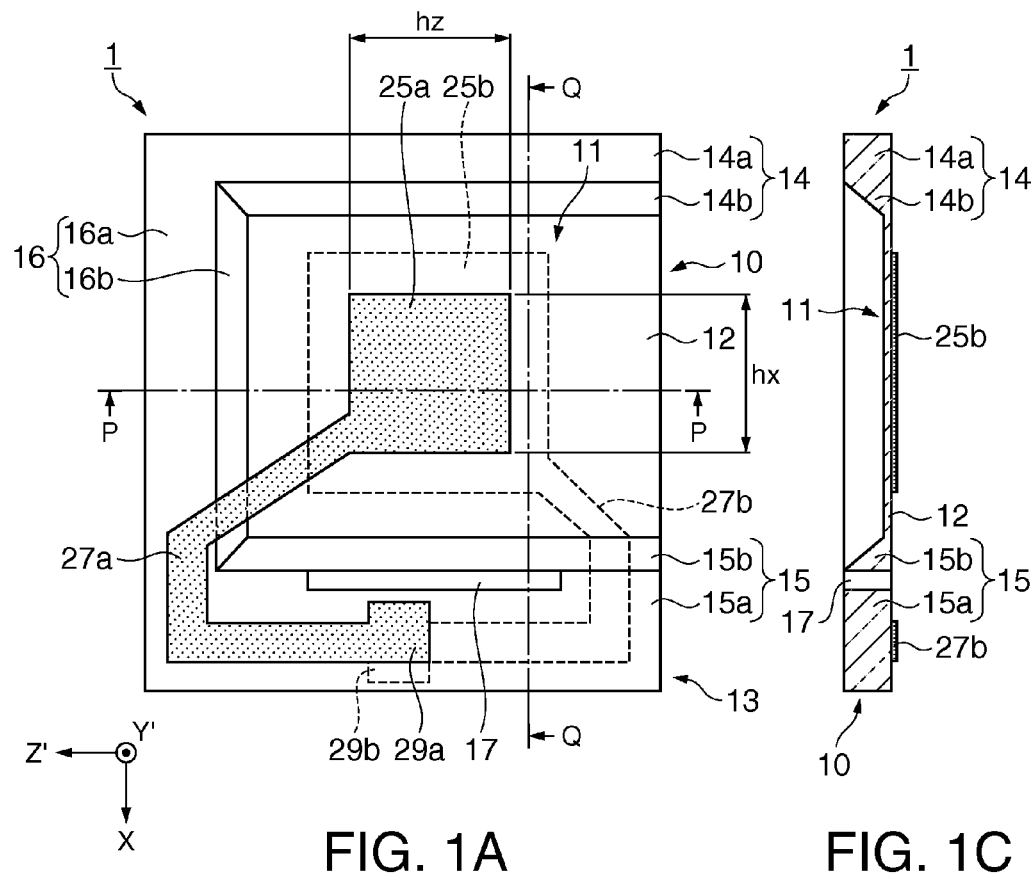
FIG. 1A
FIG. 1C
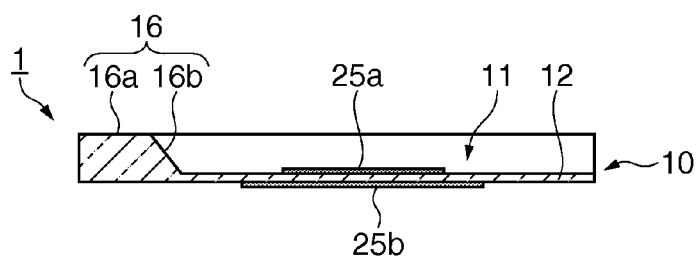
FIG. 1B

| RESONANT FREQUENCY [MHz] | hx [nm] | hz [nm] | hx/hz | Au [nm] | Ni [nm] | CONFINEMENT FACTOR M | Cl[Ω] | SPURIOUS RATIO (Cls/Clm) |
|---|---|---|---|---|---|---|---|---|
| 491 | 0.14 | 0.11 | 1.27 | 45 | 7 | 12.0 | 23.5 | 4.7 |
| | 0.18 | 0.14 | 1.29 | 45 | 7 | 15.5 | 20.0 | 4.5 |
| | 0.18 | 0.14 | 1.29 | 60 | 7 | 18.9 | 19.5 | 4.1 |
| | 0.23 | 0.18 | 1.28 | 60 | 7 | 24.1 | 16.7 | 3.1 |
| | 0.21 | 0.16 | 1.31 | 90 | 7 | 30.2 | 13.1 | 2.7 |
| | 0.23 | 0.18 | 1.28 | 90 | 7 | 33.1 | 13.2 | 2.3 |
| | 0.3 | 0.24 | 1.25 | 90 | 7 | 43.2 | 11.5 | 1.5 |
| 368 | 0.18 | 0.14 | 1.29 | 90 | 7 | 15.4 | 21.4 | 4.9 |
| | 0.3 | 0.24 | 1.25 | 90 | 7 | 25.7 | 15.7 | 3.8 |
| | 0.5 | 0.4 | 1.25 | 90 | 7 | 42.8 | 11.8 | 1.5 |
| 246 | 0.28 | 0.22 | 1.27 | 120 | 7 | 14.7 | 22.1 | 4.6 |
| | 0.4 | 0.32 | 1.25 | 120 | 7 | 20.9 | 17.8 | 4.0 |
| | 0.7 | 0.56 | 1.25 | 120 | 7 | 36.7 | 14.0 | 2.5 |

FIG. 4

| RESONANT FREQUENCY [MHz] | ELECTRODE DIMENSION hx X hz [mm] | FILM THICKNESS OF EXCITATION ELECTRODE [nm] | FILM THICKNESS OF LEAD ELECTRODE [nm] | CI[Ω] |
|---|---|---|---|---|
| 491 | 0.23 X 0.18 | 90 | 200 | 13.2 |
| | | | 0 | 25.1 |

FIG. 7

RESONATOR ELEMENT, RESONATOR, ELECTRONIC DEVICE, ELECTRONIC APPARATUS, AND MOBILE OBJECT

BACKGROUND

1. Technical Field

The present invention relates to a resonator element for exciting a thickness-shear vibration, a resonator, an electronic device, an electronic apparatus, and a mobile object.

2. Related Art

An AT-cut quartz crystal resonator for exciting a thickness-shear vibration as a vibration mode of the principal vibration is suitable for miniaturization and higher frequency, and has a frequency-temperature characteristic showing an excellent cubic curve, and is therefore used in a variety of fields such as an oscillator and electronic apparatus. In particular, in recent years, due to the progress in speeding up of the processing speed of transmission communication equipment and OA equipment, or increase in capacity of communication data and a processing amount, a demand of increase in frequency to the AT-cut quartz crystal resonator as a reference frequency signal source used therefor is increasing.

JP-A-11-284484 (Document 1) discloses an AT-cut quartz crystal resonator having an inverted mesa structure achieving increase in frequency by forming a recessed section in a part of the principal surface. Specifically, it reads that a preferable frequency-temperature characteristic can be obtained in the quartz crystal resonator for obtaining a fundamental vibration equal to or higher than 300 MHz by setting the ratio between the thickness of a quartz crystal substrate and a film thickness obtained by converting the electrode film thickness into a quartz crystal density to 7% through 13%.

Further, JP-A-2005-203858 (Document 2) discloses an AT-cut quartz crystal resonator having the inverted mesa structure achieving increase in frequency by forming a recessed section in a part of the principal surface similarly to Document 1. Specifically, it reads that in the quartz crystal resonator for obtaining the fundamental vibration equal to or higher than 300 MHz, by setting the ratio between the thickness of the quartz crystal substrate and the electrode film thickness to 0.014 or equal to or lower than 0.012 (19.2% or equal to or lower than 16.5% in the ratio between the thickness of the quartz crystal substrate and the film thickness obtained by converting the electrode film thickness into the quartz crystal density), the frequency variation before and after a reflow process is prevented, and a preferable frequency-temperature characteristic can be obtained.

Incidentally, it has turned out that if it is attempted to achieve miniaturization and higher frequency of the quartz crystal resonator vibrating at a resonant frequency of a fundamental vibration equal to or higher than 200 MHz, there is a problem that there arises the case in which the quartz crystal resonator provided with such a structure as described above fails to fulfill the required specification of a crystal impedance (CI, an equivalent resistance of the quartz crystal resonator) value required in a oscillator circuit. In particular, if the frequency rises to a high frequency equal to or higher than 200 MHz, the electrode thickness of the excitation electrodes and the lead electrodes provided to the quartz crystal resonator significantly affects the CI value of the principal vibration. If it is attempted to set only the principal vibration of the quartz crystal resonator to a confinement mode, it is required to thin the electrode film, and if the thickness of the electrode film decreases to a value equal to or smaller than 100 nm due to the thinning of the electrode film, the sheet resistance rapidly increases, and therefore, there is a problem that a significant ohmic loss (ohmic loss due to the surface resistance) occurs in the excitation electrode section and the lead electrode section, and as a result, the CI value of the quartz crystal resonator increases.

Further, if the film thickness is increased in order to prevent the ohmic loss in the electrode film, there is a problem that a lot of vibrations in inharmonic mode are confined in addition to the principal vibration to cause spurious, and the CI value of the spurious adjacent to the principal vibration is smaller than the CI value of the principal vibration according to conditions, and thus the oscillator circuit oscillates at the resonant frequency of the spurious.

SUMMARY

An advantage of some aspects of the invention is to improve the spurious due to the inharmonic mode in providing a resonator element.

The invention can be implemented as the following forms or application examples.

APPLICATION EXAMPLE 1

A resonator element according to this application example includes a substrate including a first principal surface and a second principal surface respectively forming an obverse surface and a reverse surface of the substrate, and vibrating in a thickness-shear vibration mode, a first excitation electrode disposed on the first principal surface, and a second excitation electrode disposed on the second principal surface, and being larger than the first excitation electrode in a plan view, the first excitation electrode fits into an outer edge of the second excitation electrode in the plan view, and the following relational expressions are fulfilled.

$$M = K \times (hx/2 \times ts) \times \sqrt{\Delta}$$

$$\Delta = (fs - fe)/fs$$

$$fs = R/[ts + te2 \times (\rho e/\rho x)]$$

$$fe = R/[ts + te \times (\rho e/\rho x)]$$

$$15.5 \leq M \leq 36.7$$

In the relational expressions, M denotes an energy trap confficient, K denotes an anisotropy factor of the substrate, hx denotes a length of the first excitation electrode along a thickness-shear vibration direction, ts denotes a thickness of the substrate, Δ denotes an amount of frequency drop, fs denotes a cut-off frequency of the substrate, fe denotes a frequency when the excitation electrodes are disposed on the substrate, R denotes a frequency constant of the substrate, te denotes a sum of a thickness of the first excitation electrode and a thickness of the second excitation electrode, te2 denotes the thickness of the second excitation electrode, ρe denotes a density of the excitation electrodes, and ρx denotes a density of the substrate.

According to this application example, in the high-frequency resonator element excited in the thickness-shear vibration mode of the fundamental wave, it becomes possible to reduce degradation of the CI value due to the influence of the ohmic loss due to thinning of the excitation electrodes and the lead electrodes to thereby reduce the excitation intensity of the spurious in the inharmonic mode determined by the dimension and the film thickness of the excitation electrodes. Thus, there can be obtained an advantage that the CI value of the principal vibration is decreased, and the resonator element with a high CI-value ratio (CIs/CIm), which is a ratio between the CI value (CIm) of the principal vibration and the CI value (CIs) of the spurious approximating the principal vibration, can be obtained.

APPLICATION EXAMPLE 2

In the resonator element according to the application example, the following relational expression is fulfilled.

$$17.1 \leq M \leq 35.7$$

According to this application example, there can be obtained an advantage that it becomes possible to further decrease the excitation intensity of the spurious in the inharmonic mode.

Application Example 3

In the resonator element according to the application example, assuming that hz denotes a length of the first excitation electrode along a direction perpendicular to the thickness-shear vibration direction, the following relational expression is fulfilled.

$$1.25 \leq hx/hz \leq 1.31$$

According to this application example, if there is used the substrate, in which the displacement distribution in the displacement direction determined by the anisotropy of the crystal and the displacement distribution in the direction perpendicular thereto are different from each other, the efficiency of energy confinement of the principal vibration can be improved. Further, the capacity ratio $\gamma$ (=C0/C1; here, C0 denotes the capacitance, C1 denotes the series resonant capacitance) of the resonator element can be decreased.

Here, if it is assumed that the resonant frequency of the thickness-shear vibration is equal to or higher than 200 MHz, since the frequency of the resonator element excited in the thickness-shear vibration mode is determined inversely proportional to the thickness of the substrate, in the case of the high frequency equal to or higher than 200 MHz, the thickness of the substrate is reduced to a value as very thin as equal to or smaller than 8.4 µm. Therefore, it is necessary to make the film thickness of the excitation electrodes formed thereon very thin accordingly. Therefore, the influence of the ohmic loss due to thinning of the electrode significantly increases, and since these problems can be reduced by setting the energy trap confficient M to the range described above, and there can be obtained an advantage that the resonator element capable of fulfilling the CI-value specification and the spurious specification required by the oscillator circuit can be obtained.

APPLICATION EXAMPLE 4

In the resonator element according to the application example, the substrate is a quartz crystal crystal substrate.

According to this application example, since the quartz crystal substrate has a high Q-value, there can be obtained an advantage that the resonator element superior in temperature characteristic can be obtained.

APPLICATION EXAMPLE 5

In the resonator element according to the application example, the quartz crystal substrate is an AT-cut quartz crystal substrate.

According to this application example, by using the AT-cut quartz crystal substrate having a cutting angle superior in temperature characteristic as the substrate, there can be obtained an advantage that the time-tested results and the experiences regarding the photolithography technology and the etching technology can be used, and thus, it becomes possible to mass-produce the resonator element with a little variation in characteristics.

APPLICATION EXAMPLE 6

A resonator according to this application example includes the resonator element according to the application example described above, and a package adapted to house the resonator element.

According to this application example, by housing the resonator element in the package, a highly reliable resonator can be obtained. For example, since the influence of a disturbance such as a temperature variation or a humidity variation, and the influence of contamination can be prevented, there can be obtained an advantage that the resonator superior in frequency reproducibility, frequency-temperature characteristic, CI-temperature characteristic, and frequency-aging characteristic can be obtained.

APPLICATION EXAMPLE 7

An electronic device according to this application example includes the resonator element according to the application example described above, and an oscillator circuit adapted to drive the resonator element.

According to this application example, by configuring the electronic device using the high-frequency resonator element excited with the fundamental wave, since the capacitance ratio of the resonator element is low, there can be obtained an advantage that a voltage controlled oscillator with a broader variable range of the frequency, and a preferable S/N ratio can be obtained.

Further, an oscillator, a temperature compensated oscillator, and so on can be configured as the electronic device, and there can be obtained an advantage that an oscillator superior in frequency reproducibility, aging characteristic, and frequency-temperature characteristic can be configured.

APPLICATION EXAMPLE 8

An electronic apparatus according to this application example includes the resonator element according to any one of the application examples described above.

According to this application example, by using the resonator element described in any one of the application examples described above in the electronic apparatus, there can be obtained an advantage that the electronic apparatus equipped with a reference frequency source superior in frequency stability in the high-frequency band, and having a preferable S/N ratio can be obtained.

APPLICATION EXAMPLE 9

A mobile object according to this application example includes the resonator element according to any one of the application examples described above.

According to this application example, the mobile object with high reliability can be obtained.

BRIEF DESCRIPTION OF THE DRAWINGS

The invention will be described with reference to the accompanying drawings, wherein like numbers reference like elements.

FIGS. 1A through 1C are schematic diagrams showing a structure of a resonator element according to an embodiment of the invention, wherein FIG. 1A is a plan view, FIG. 1B is a P-P cross-sectional view, and FIG. 1C is a Q-Q cross-sectional view.

FIG. 4 is a diagram showing test production conditions and measurement results of an AT-cut quartz crystal resonator element.

FIG. 7 is a diagram showing the test production conditions and the CI value of the AT-cut quartz crystal resonator element having a lead electrode and a pad electrode each formed as a thick film.

FIGS. 8A and 8B are schematic diagrams showing a structure of the resonator according to an embodiment of the invention, wherein FIG. 8A is a plan view, and FIG. 8B is a vertical cross-sectional view.

FIGS. 9A and 9B are schematic diagrams showing a structure of an electronic device according to an embodiment of the invention, wherein FIG. 9A is a plan view, and FIG. 9B is a vertical cross-sectional view.

DESCRIPTION OF EXEMPLARY EMBODIMENTS

Figure 2:
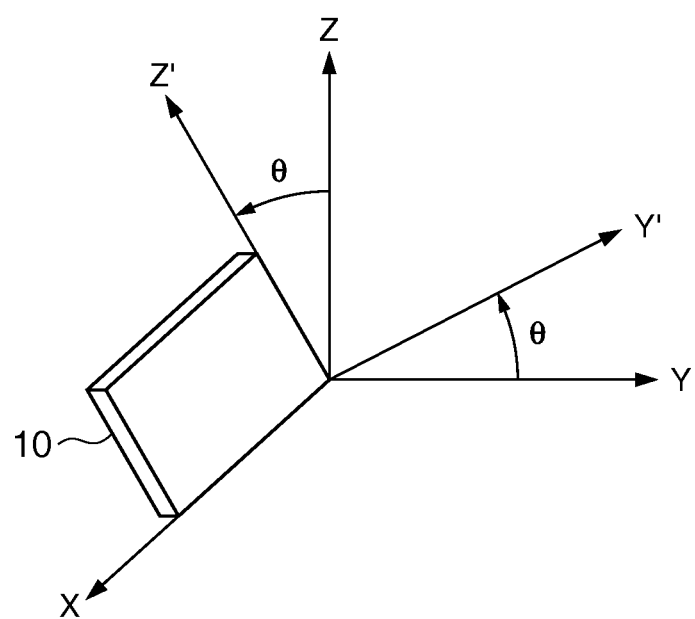
FIG. 2 is a diagram for explaining a relationship between an AT-cut quartz crystal substrate and a crystal axes.

Hereinafter, a resonator element, a resonator, an electronic device, an electronic apparatus, and a mobile object according to the invention will be explained in detail based on the preferred embodiments shown in the accompanying drawings.

1. Resonator Element

Firstly, a resonator element according to an embodiment of the invention will be explained.

FIGS. 1A through 1C are schematic diagrams showing a configuration of a resonator element according to an embodiment of the invention, wherein FIG. 1A is a plan view of the resonator element, FIG. 1B is a P-P cross-sectional view of FIG. 1A, and FIG. 1C is a Q-Q cross-sectional view of FIG. 1A.

The resonator element 1 is provided with a substrate 10 having a vibrating section 12 and a thick-wall section 13 integrated with the vibrating section 12 and having a thickness larger than the thickness of the vibrating section 12, excitation electrodes 25a, 25b formed on both of the principal surfaces (obverse and reverse surfaces in ±Y' directions) of the vibrating section 12 so as to be opposed to each other, and lead electrodes 27a, 27b formed so as to extend from the excitation electrodes 25a, 25b toward pad electrodes 29a, 29b provided to the thick-wall section, respectively.

The substrate 10 is provided with the vibrating section 12, which has a rectangular shape, and is shaped like a thin-wall plate perpendicular to the Y' axis with a constant thickness, the thick-wall section 13 composed of a first thick-wall section 14, a second thick-wall section 15, and a third thick-wall section 16 (also referred to as first, second, and third thick-wall sections 14, 15, and 16) integrated along the three sides except one side of the vibrating section 12, and a slit 17 for preventing a mount stress caused when fixing and supporting the substrate 10 from being transmitted to the vibrating section 12.

It should be noted that a first thick-wall main body 14a, a second thick-wall main body 15a, and a third thick-wall main body 16a (also referred to as first, second, and third thick-wall main bodies 14a, 15a, and 16a) each denote a region having an even thickness in a direction parallel to the Y' axis.

Further, a first tilted portion 14b, a second tilted portion 15b, and a third tilted portion 16b (also referred to as first, second, and third tilted portions 14b, 15b, and 16b) denote tilted surfaces appearing between the first, second, and third thick-wall main bodies 14a, 15a, and 16a and the vibrating section 12, respectively.

One of the principal surfaces of the vibrating section 12 and one of the surfaces of each of the first, second, and third thick-wall sections 14, 15, and 16 are disposed on the same plane, namely on the X-Z' plane of the coordinate axes shown in FIG. 1A, the surface (the lower surface side located on the −Y' direction in FIG. 1B) is called a flat surface, and the opposite surface (the upper surface side located on the +Y' direction in FIG. 1B) having a recessed section 11 is called a recessed surface.

In the embodiment shown in FIGS. 1A through 1C, the excitation electrodes 25a, 25b each have a rectangular shape, and are formed so as to overlap the respective principal surfaces (the obverse surface and the reverse surface) of a roughly central portion of the vibrating section 12 in a plan view. The excitation electrode 25a as a first excitation electrode and the excitation electrode 25b as a second excitation electrode are different in size from each other, and the excitation electrode 25b is larger than the excitation electrode 25a. The region actually excited in the vibrating section 12 is the region sandwiched between the excitation electrode 25a and the excitation electrode 25b. Specifically, the region making a contribution in actually exciting the vibrating section 12 in the excitation electrode 25b (the second excitation electrode) is a portion overlapping the excitation electrode 25a (the first excitation electrode) in a plan view. In other words, the second excitation electrode is composed of the electrode making a contribution to the excitation and the electrode, which is integrated with the outer edge of the electrode making the contribution to the excitation, and does not make a contribution to the excitation.

The lead electrode 27a extends from the excitation electrode 25a formed on the recessed surface, passes on the tilted portion 16b and the third thick-wall main body 16a from the surface of the vibrating section 12, and is conductively connected to the pad electrode 29a formed on the recessed surface of the second thick-wall main body 15a. Further, the lead electrode 27b extends from the excitation electrode 25b formed on the flat surface, and is conductively connected to the pad electrode 29b formed on the flat surface of the second thick-wall main body 15a via an end edge portion of the flat surface of the substrate 10.

It should be noted that regarding portions connected to the lead electrodes 27a, 27b, the shapes and the areas of the excitation electrodes 25a, 25b will be explained taking an extended line (an imaginary line) along the outer edge (the outer side) of the excitation electrode shape as a boundary.

The embodiment shown in FIG. 1A is an example of an extraction structure of the lead electrodes 27a, 27b, and the lead electrode 27a can pass on another thick-wall section. However, it is desirable that the lengths of the lead electrodes 27a, 27b are the shortest, and it is desirable to suppress increase in capacitance by giving consideration to preventing the lead electrodes 27a, 27b from intersecting with each other across the substrate 10.

Further, the excitation electrodes 25a, 25b, the lead electrodes 27a, 27b, and the pad electrodes 29a, 29b are deposited by, for example, depositing nickel (Ni) as a foundation layer, and stacking gold (Au) as an upper layer thereon using a vapor deposition device, a sputtering device, or the like. It should be noted that it is also possible to use chromium (Cr) instead of nickel (Ni) of the foundation layer, and silver (Ag) or platinum (Pt) instead of gold (Au) of the upper layer as the electrode materials.

A piezoelectric material such as a quartz crystal belongs to a trigonal system, and has the crystal axes X, Y, and Z perpendicular to each other as shown in FIG. 2. The X axis, the Y axis, and the Z axis are called an electrical axis, a mechanical axis, and an optical axis, respectively. Further, among the quartz crystal substrates, a "rotated Y-cut quartz crystal substrate" carved out from the quartz crystal along a plane obtained by rotating the X-Z plane as much as an angle θ around the X axis is used as the substrate 10. For example, in the case of the AT-cut quartz crystal substrate, the angle θ is about 35° 15'. It should be noted that the Y' axis and the Z' axis are also obtained by rotating the Y axis and the Z axis as much as the angle θ around the X axis, respectively. Therefore, the AT-cut quartz crystal substrate has the crystal axes X, Y', and Z' perpendicular to each other. In the AT-cut quartz crystal substrate, the thickness direction is the Y'-axis direction, the principal surface is the X-Z' plane (the plane including the X axis and the Z' axis) perpendicular to the Y' axis, and the thickness-shear vibration is excited as the principal vibration.

In other words, as shown in FIG. 2, assuming that an axis obtained by tilting the Z axis described above so that the +Z side thereof is rotated toward the −Y direction of the Y axis described above taking the X axis of the orthogonal coordinate system composed of the X axis (the electrical axis), the Y axis (the mechanical axis), and the Z axis (the optical axis) as the rotational axis is the Z' axis, and an axis obtained by tilting the Y axis described above so that the +Y side thereof is rotated toward the +Z direction of the Z axis described above taking the X axis as the rotational axis is the Y' axis, the substrate 10 is the "rotated Y-cut quartz crystal substrate" taking the plane including the X axis described above and the Z' axis described above as a principal surface, and taking the direction along the Y' axis described above as the thickness direction.

It should be noted that the substrate 10 according to this embodiment is not limited to the AT-cut substrate with the angle θ of approximately 35° 15', but can widely be applied to, for example, a BT-cut substrate for exciting the thickness-shear vibration.

Further, although the explanation is presented using the example of disposing the thick-wall section along the outer edge of the vibrating section 12, the invention is not limited thereto, but can widely be applied also to a substrate having the thick-wall section disposed along the entire outer edge of the vibrating section 12, and a plate-like substrate not provided with the thick-wall section.

In general, in the thickness-shear vibration mode, by forming a partial electrode on the substrate or providing a thickness difference, the vibration energy can be confined in the vicinity of that part, and a stable resonant frequency can be obtained. The resonant frequency of the confinement mode in this case is expressed as a function of the energy trap confficient M obtained by the thickness is of the substrate, and the film thickness to and the size hx of the excitation electrode.

The energy trap confficient M is expressed by the formula 1 described below.

$$M = K \times (hx/2 \times ts) \times \sqrt{\Delta} \tag{1}$$

Here, K denotes the anisotropy factor (1.538 in the case of the AT-cut substrate) of the substrate, hx denotes a dimension of the excitation electrode along the displacement direction of the thickness-shear vibration, is denotes the thickness of the substrate, and Δ denotes an amount of frequency drop. It should be noted that in the case in which the excitation electrode has a shape other than a rectangular shape such as a circular shape or an elliptical shape, hx denotes the maximum value of the lengths along the displacement direction in the thickness-shear vibration mode as the dimension.

Further, the amount of frequency drop A is expressed by the formula 2 described below.

$$\Delta = (fs - fe)/fs \tag{2}$$

Here, fs denotes a cut-off frequency of the substrate, and fe denotes the frequency in the case of depositing the excitation electrode on the entire surface of the substrate.

It should be noted that if the shape and the area are the same between the obverse and reverse excitation electrodes, the cut-off frequency fs of the substrate is expressed by the formula 3 described below, and the frequency fe in the case of depositing the excitation electrode on the entire surface of the substrate is expressed by the formula 4 described below.

$$fs = R/ts \tag{3}$$

$$fe = R/[ts + te \times (\rho e/\rho x)] \tag{4}$$

Here, R denotes the frequency constant of the substrate, is denotes the thickness of the substrate, to denotes the sum of the thicknesses of the obverse and reverse excitation electrodes, ρe denotes the density of the excitation electrode, and ρx denotes the density of the substrate.

Further, if the shape and the area are different between the obverse and reverse excitation electrodes, the cut-off frequency fs of the substrate is expressed by the formula 5 described below, and the frequency fe in the case of depositing the excitation electrode on the entire surface of the substrate is expressed by the formula 6 described below.

$$fs = R/[ts + te2 \times (\rho e/\rho x)] \tag{5}$$

$$fe = R/[ts + te \times (\rho e/\rho x)] \tag{6}$$

Here, R denotes the frequency constant of the substrate, ts denotes the thickness of the substrate, te2 denotes the thickness of the excitation electrode with a larger area, te denotes the sum of the thicknesses of the obverse and reverse excitation electrodes, ρe denotes the density of the excitation electrode, and ρx denotes the density of the substrate. Further, in the formula 1, hx denotes the dimension of the excitation electrode with a smaller area along the displacement direction of the thickness-shear vibration.

According to the formula 1 through the formula 6, in the case in which the shape and the area are different between the obverse and reverse excitation electrodes, if the thickness ts of the substrate, the thickness te and the dimension hx of the excitation electrode, and so on are in the same conditions, it results that the thickness of the excitation electrode with a larger area is added to the thickness of the substrate compared to the case in which the shape and the area are the same between the obverse and reverse excitation electrodes, and therefore, it results that the cut-off frequency fs of the substrate drops due to the increase in thickness of the substrate. Therefore, since the amount of frequency drop Δ decreases, the energy trap conffficient M decreases, and it becomes easy to reduce the spurious in the inharmonic mode.

Further, in the case of keeping the energy trap conffficient M constant, the film thickness to of the excitation electrode can be set thicker compared to the case in which the shape and the area are the same between the obverse and reverse excitation electrodes.

In general, it is said that in the thickness-shear vibration mode of the AT-cut quartz crystal substrate, the requirement for confining the single mode of the fundamental wave is that the energy trap coefficient M is equal to or lower than 2.8.

For example, in the case of the AT-cut quartz crystal resonator element resonating at a resonance frequency in the 491 MHz band, if the excitation electrode dimension hx is set to 0.30 mm, the thickness for achieving the energy trap conffficient M=2.8 is as very thin as about 1 nm, which is an unachievable film thickness from a manufacturing point of view, and even if the film thickness can be realized, the CI-value increases significantly due to the influence of the ohmic loss caused by the thinning of the electrode, and it is unachievable to cause oscillation in the oscillator circuit.

Therefore, in the high frequency band, if the film deposition is performed so as to avoid the ohmic loss due to the film thickness of the electrode (the film thickness is increased), the energy trap conffficient M becomes dramatically higher than the value of 2.8 with which only the principal vibration is confined, and therefore, it is unavoidable that the spurious in the low-order inharmonic mode is confined besides the principal vibration. However, it can be said that if the CI-value ratio between the minimum CI value of the spurious thus confined and the principal-vibration CI value is equal to or higher than 1.8, it does not theoretically occur to oscillate at the spurious frequency in the inharmonic mode. Therefore, the inventors of the invention have realized that by decreasing the CI value of the principal vibration to a value as small as equal to or lower than 20Ω, and setting the CI-value ratio between the CI value of the principal vibration and the CI value of the spurious to a value equal to or higher than 2.0 taking a production tolerance into consideration, it becomes possible to oscillate while fulfilling the required specification of the oscillator circuit, and thus the practical use thereof is possible.

Figure 3:
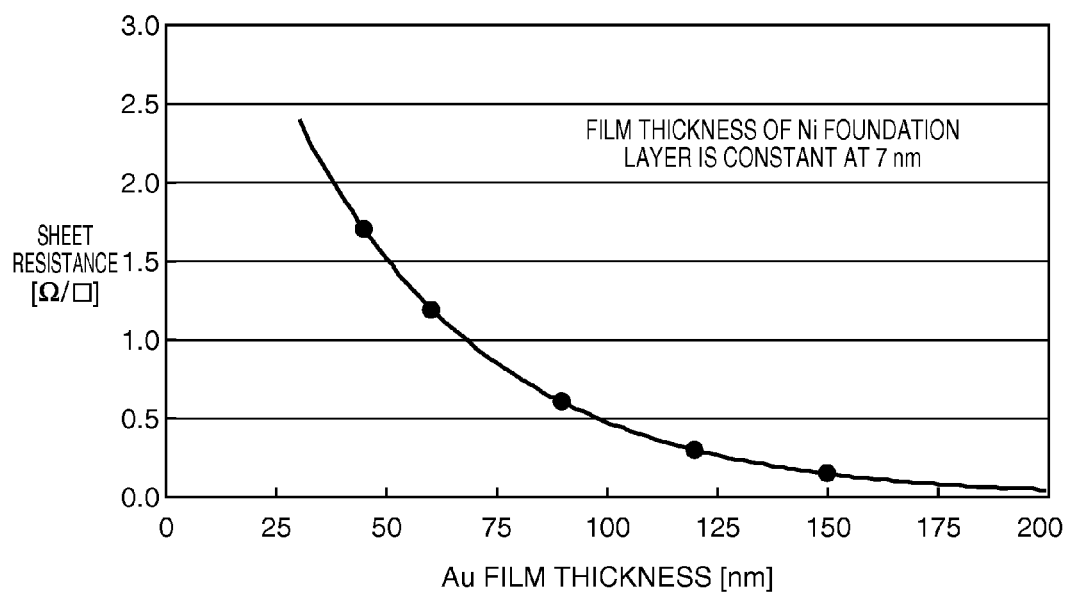
FIG. 3 is a diagram showing a resistance with respect to the film thickness of an electrode.

FIG. 3 shows the thickness of the gold (Au) layer as the upper layer and the sheet resistance value using nickel (Ni) as the foundation layer. FIG. 3 shows a measurement result of the sheet resistance in the case in which the thickness of the nickel (Ni) layer as the foundation layer is kept constant at 7 nm, and the thickness of gold (Au) is varied in a range of 45 nm through 150 nm. From FIG. 3, it is understood that the sheet resistance rapidly increases when the thickness reaches a level equal to or lower than 90 nm. Therefore, in order to prevent the CI value of the principal vibration from increasing due to the influence of the ohmic loss without using the film thickness of the excitation electrode for determining the energy trap conffficient M, it is necessary to increase the film thickness of the lead electrodes 27a, 27b and the pad electrodes 29a, 29b. In particular, the lead electrode section is thin and long compared to the pad electrode section, and therefore has a significant influence on the ohmic loss. For example, if it is assumed that the length of the lead electrode section is 10 squares (the length of 10 squares connected in series to each other), in order to set the resistance value of the lead electrode section to be equal to or lower than 2Ω, it is required to set the thickness of the electrode to be equal to or greater than 150 nm so that the sheet resistance of 0.2 Ω/sq is obtained according to FIG. 3.

In the embodiment shown in FIG. 1A, the planar shape of the excitation electrode 25a on the recessed surface side (the obverse side in FIG. 1B) is set to have a size fit into the outer edge of the outer shape of the excitation electrode 25b on the flat surface side (the reverse side in FIG. 1B). In other words, the excitation electrode 25a is formed to have a shape smaller than that of the excitation electrode 25b. This is for preventing the energy trap conffficient M due to the mass-loading effect of the excitation electrode from unnecessarily increasing. Specifically, since the amount of frequency drop Δ depends only on the mass-loading effect of the excitation electrode 25a on the obverse side (the upper side), the energy trap conffficient M is decreased by approximately half by enlarging the excitation electrode 25b on the reverse side (the lower side). Therefore, the spurious in the inharmonic mode thus confined can be reduced.

For example, if the film thickness of each of the excitation electrodes 25a, 25b is set to 60 nm in the case in which the electrodes have the same shape and the same area between the obverse and reverse sides, the film thickness of each of the excitation electrodes 25a, 25b becomes 120 nm in the case in which the electrodes are different from each other in the shape and the area in order to make the energy trap conffficient M equivalent to that in the case in which the shape and the area are the same between the obverse and reverse sides. By calculating the resistance values of the excitation electrode section in each of the electrode film thicknesses, the resistance value in the obverse and reverse excitation electrode sections becomes about 2.4Ω since the sheet resistance of the electrode with the film thickness of 60 nm is 1.2 Ω/sq in the case in which the shape and the area are the same between the obverse and reverse sides according to FIG. 3. In contrast, in the case in which the shape and the area are different between the obverse and reverse sides, the sheet resistance of the electrode with the film thickness of 120 nm becomes 0.3 Ω/sq, and the resistance value in the obverse and reverse excitation electrode sections becomes about 0.6Ω. Therefore, in the case of designing the resonator element having an equivalent energy trap conffficient M, the design of making the shape and the area different between the obverse and reverse excitation electrodes can reduce the influence of the ohmic loss to about a quarter of the other design, and is therefore advantageous in decreasing the CI value.

FIG. 4 is a diagram showing test production conditions and measurement results of the AT-cut quartz crystal resonator element, which vibrates at the resonant frequency in the band of 246 MHz through 491 MHz, and is experimentally manufactured in the embodiment shown in FIGS. 1A through 1C.

In the obverse and reverse excitation electrodes 25a, 25b, the thickness of the nickel (Ni) layer as the foundation layer is fixed to 7 nm, and the thickness of the gold (Au) layer as the upper layer is varied in a range of 45 nm through 120 nm. Regarding the dimension of the excitation electrode 25a, hx is varied in a range of 0.14 mm through 0.70 mm, and hz is varied in a range of 0.11 mm through 0.56 mm so that hx/hz fulfills 1.25≤hx/hz≤1.31 centered on hx/hz=1.28. It should be noted that hz denotes the dimension (the length) of the excitation electrode 25a along the direction perpendicular to the thickness-shear vibration direction.

Further, in order to avoid the influence of the ohmic loss, the lead electrodes 27a, 27b and the pad electrodes 29a, 29b on the obverse and reverse sides are each formed by stacking a layer of nickel (Ni) with a thickness of 7 nm in an upper layer section of a layer provided with the thickness equivalent to the excitation electrodes, and then stacking a gold (Au) layer with a thickness of 200 nm thereon.

Here, the test production conditions shown in FIG. 4 fulfill the formulas 1, 2, 5, and 6 described above.

$$M = K \times (hx/2 \times ts) \times \sqrt{\Delta} \quad (1)$$

$$\Delta = (fs - fe)/fs \quad (2)$$

$$fs = R/[ts + te2 \times (\rho e/\rho x)] \quad (5)$$

$$fe = R/[ts + te \times (\rho e/\rho x)] \quad (6)$$

It should be noted that the parameters therein are as follows.

$$K = 1.538$$

$$R = 1.67 (\text{MHz·mm})$$

$$\rho x = 2.649 (\text{g/cm}^3)$$

$$\rho_{Au}(\text{density of gold}) = 19.3 (\text{g/cm}^3)$$

$$\rho_{Ni}(\text{density of nickel}) = 8.9 (\text{g/cm}^3)$$

The density $\rho e$ of the excitation electrode formed of a double-layered structure is calculated as follows.

$$\rho e = (\rho_{Au} \times t_{Au} + \rho_{Ni} \times t_{Ni})/(t_{Au} + t_{Ni})$$

Here, $t_{Au}$ denotes the thickness of the gold (Au) layer as the upper layer, and $t_{Ni}$ denotes the thickness of the nickel (Ni) layer as the foundation layer.

The parameter fs denotes the cut-off frequency of the vibrating section 12, fe denotes a frequency in the case of providing the excitation electrode to the vibrating section 12.

According to FIG. 4, it is understood that when the energy trap confficient M is set to fulfill $15.5 \leq M \leq 36.7$, the CI value of the principal vibration can be reduced to a value equal to or lower than 20 ($\Omega$).

Figure 5:
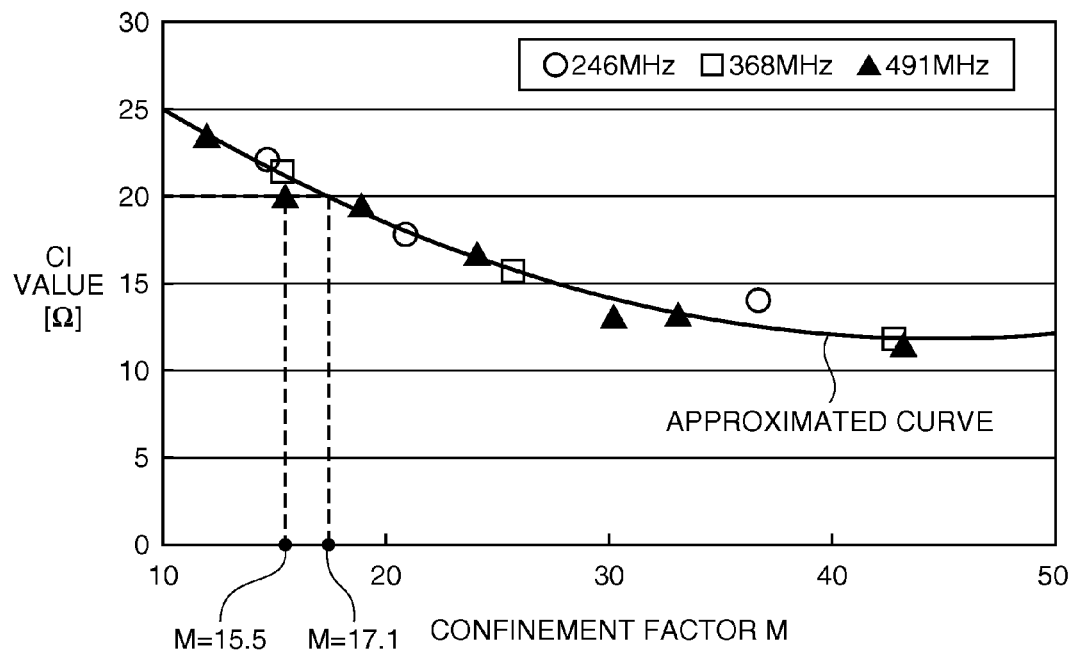
FIG. 5 is a diagram showing a CI value of a resonator with respect to an energy trap confficient M.

FIG. 5 shows the CI value with respect to the energy trap confficient M of the AT-cut quartz crystal resonator element shown in FIG. 4 by plotting it on a graph. As the energy trap confficient M increases, the CI value shows a tendency of decreasing, and the reason can be thought that the influence of the ohmic loss is reduced due to the increase in the film thickness of the electrode, and that the excitation charge increases and the resistance is decreased due to the increase in the electrode area.

Therefore, according to FIG. 5, by setting the energy trap confficient M to be equal to or higher than 17.1, the CI value specification (CI≤20Ω) required by the oscillator circuit can be satisfied.

Figure 6:
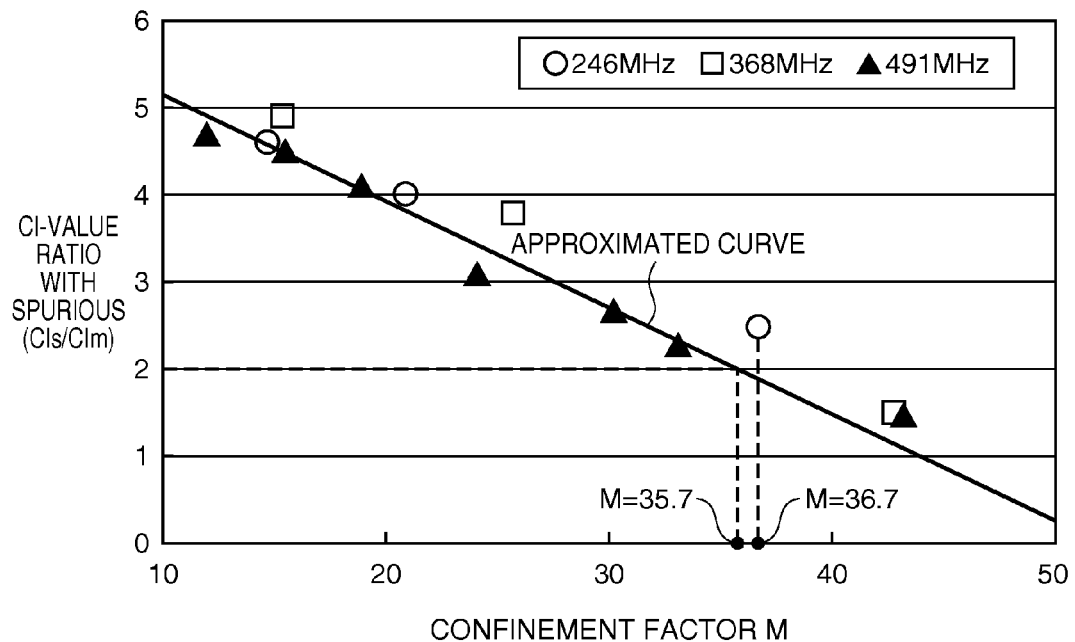
FIG. 6 is a diagram showing a CI-value ratio between a principal-vibration CI value of a resonator and a spurious CI value with respect to the energy trap confficient M.

FIG. 6 shows the CI-value ratio (CIs/CIm) between the CI value (CIm) of the principal vibration and the CI value (CIs) of the spurious with respect to the energy trap confficient M of the AT-cut quartz crystal resonator element shown in FIG. 4. As the energy trap confficient M increases, the CI-value ratio (CIs/CIm) shows a tendency of decreasing, and the reason can be thought that the spurious in the inharmonic mode is strongly confined due to the increase in the film thickness or the area of the excitation electrode.

According to FIG. 6, by setting the energy trap confficient M to be equal to or lower than 35.7, the spurious specification (CIs/CIm≥2.0) required by the oscillator circuit can be satisfied.

From the result described above, it turns out that if the shape and the area are different between the excitation electrodes 25a, 25b on the obverse and reverse sides, the CI value specification (CI≤20Ω) and the spurious specification (CIs/CIm≥2.0) required by the oscillator circuit are simultaneously fulfilled only when the energy trap confficient M fulfills $17.1 \leq M \leq 35.7$.

Although in the embodiment shown in FIGS. 1A through 1C, the example of adopting a quadrangle such as a square or a rectangle (with the long side in the X-axis direction) as the shape of the excitation electrodes 25a, 25b is described, there is no need to limit the invention to this example. It is also possible that the excitation electrode 25a on the obverse side has a circular shape or an elliptical shape, and the excitation electrode 25b on the reverse side has a rectangular shape, a circular shape, or an elliptical shape sufficiently larger than the excitation electrode 25a.

Further, in the case of the thickness-shear vibration mode using the AT-cut quartz crystal substrate, the displacement distribution in the displacement direction determined by the anisotropy of the crystal and the displacement distribution in the direction perpendicular thereto are different from each other, and it is said that the electrode dimension ratio (hx/hz) of about 1.28 provides the highest efficiency. Therefore, the excitation electrode shape having an elliptical shape or a rectangular shape with that ratio can minimize the capacitance ratio γ (=C0/C1; here, C0 denotes the capacitance, C1 denotes the series resonant capacitance) of the quartz crystal resonator element.

Then, the experimental result of making the lead electrodes 27a, 27b and the pad electrodes 29a, 29b on the obverse and reverse sides as thick films in order for avoiding the influence of the ohmic loss will be shown in FIG. 7. In the thick film process, in the upper layer section of the layer provided with the equivalent film thickness to the excitation electrodes 25a, 25b, the nickel (Ni) film is stacked with the film thickness of 7 nm, and then gold (Au) with the thickness of 200 nm is stacked thereon. FIG. 7 is a diagram showing the CI value with respect to the lead electrode thickness of the AT-cut quartz crystal resonator element, which vibrates at the resonant frequency in the 491 MHz band, and is experimentally manufactured in the embodiment shown in FIGS. 1A through 1C.

According to FIG. 7, by making the lead electrodes 27a, 27b and the pad electrodes 29a, 29b as the thick films, the CI value can be decreased from 25.1Ω to 13.2Ω. Therefore, it is effective for decreasing the CI value of the resonator element 1 to make the lead electrodes 27a, 27b and the pad electrodes 29a, 29b as the thick films. In particular, it is significantly effective for decreasing the CI value to make the lead electrodes 27a, 27b, which are required to be made thin and long, as the thick films.

2. Resonator

Then, the resonator (the resonator according to the embodiment of the invention) to which the resonator element 1 described above is applied will be explained.

Figure 8A:
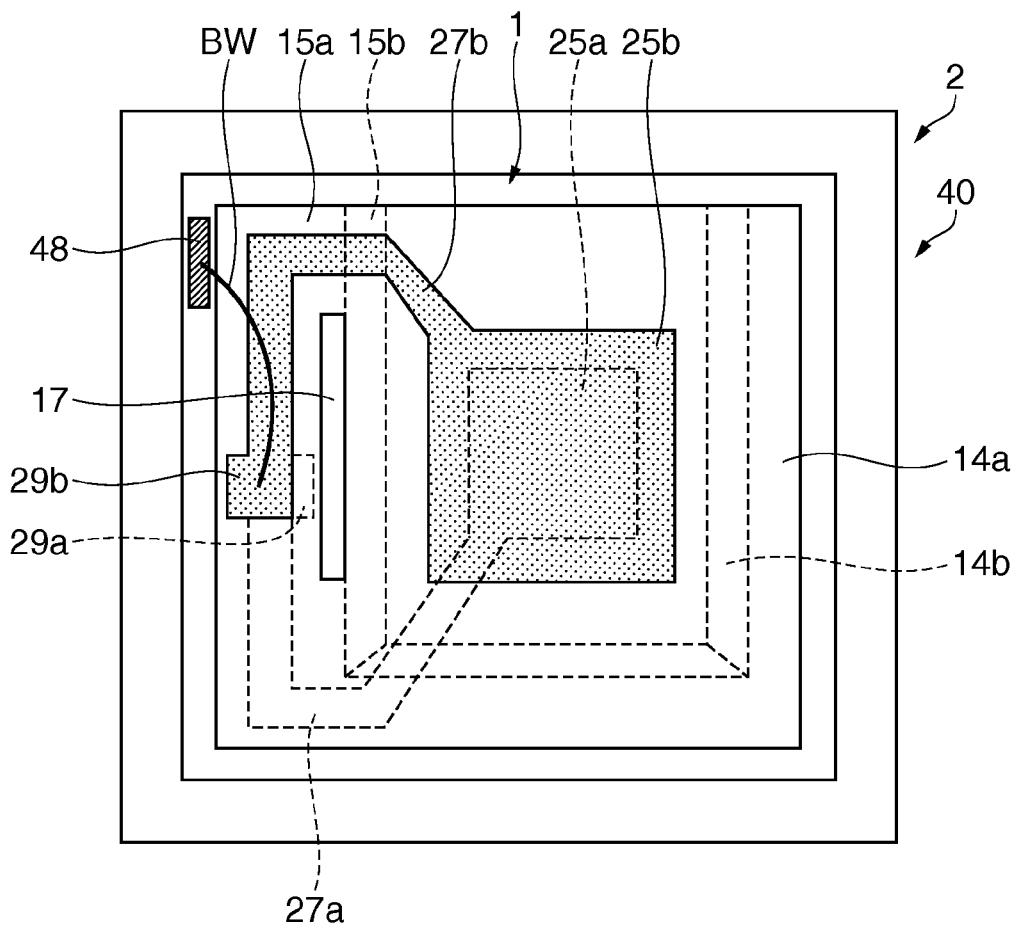
Figure 8B:
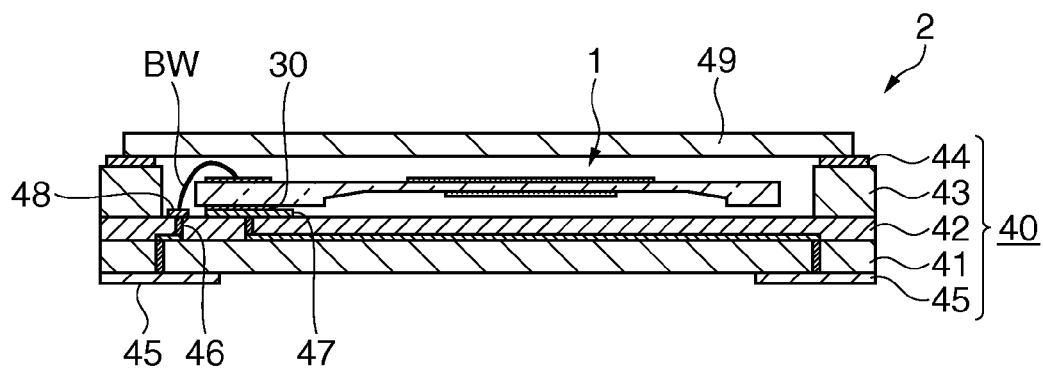

FIGS. 8A and 8B are schematic diagrams showing a configuration of the resonator according to the embodiment of the invention, wherein FIG. 8A is a plan view with a lid member omitted, and FIG. 8B is a vertical cross-sectional view. The resonator 2 is composed of the resonator element 1, a package main body 40 formed to have a rectangular box shape in order to house the resonator element 1, and a lid member 49 made of, for example, metal, ceramic, or glass.

As shown in FIGS. 8A and 8B, the package main body 40 is formed by stacking a first substrate 41, a second substrate 42, a third substrate 43, a seal ring 44, a plurality of mounting terminals 45 on each other. The plurality of mounting terminals 45 are formed on an exterior bottom surface of the first substrate 41. The third substrate 43 is a ring-like member with the central portion removed, and on the upper peripheral edge of the third substrate 43, there is formed the seal ring 44 made of, for example, Kovar™.

The third substrate 43 and the second substrate 42 constitute a recessed section (a cavity) for housing the resonator element 1. At predetermined positions on the upper surface of the second substrate 42, there is disposed a plurality of element mounting pads 47 having electrical conduction with the mounting terminal 45 with a conductor 46. The element mounting pads 47 are arranged so as to correspond to the pad electrode 29a provided to the second thick-wall main body 15a when mounting the resonator element 1.

When fixing the resonator element 1, firstly, the resonator element 1 is flipped (reversed), then the pad electrode 29a is mounted on the element mounting pads 47 coated with an electrically conductive adhesive 30, and then load is applied thereon. As the electrically conductive adhesive 30, a polyimide adhesive with little outgas is used taking aging into consideration.

Then, in order to cure the electrically conductive adhesive 30 of the resonator element 1 mounted on the package main body 40, the package main body 40 and the resonator element are put into a high-temperature oven at predetermined temperature for a predetermined time period. After curing the electrically conductive adhesive 30, the pad electrode 29b having appeared on the upper surface by flipping and an electrode terminal 48 of the package main body 40 are conductively connected to each other with a bonding wire BW. As shown in FIG. 8B, since the resonator element 1 is supported by and fixed to the package main body 40 at one place (one point), it becomes possible to reduce the level of the mounting stress generated by supporting and fixing the resonator element 1.

After performing an annealing treatment thereon, frequency adjustment is performed by adding or removing a mass to or from the excitation electrode 25b. Subsequently, the lid member 49 is mounted on the seal ring 44 formed on the upper surface of the package main body 40, and then sealing is performed by seam welding the lid member 49 in a reduced-pressure atmosphere, or a nitrogen gas atmosphere to thereby complete the resonator 2. Alternatively, there can also be adopted a method of mounting the lid member 49 on a low-melting-point glass applied on the upper surface of the third substrate 43 of the package main body 40, and then melting the low-melting-point glass to thereby make the lid member 49 adhere. Also in this case, the cavity of the package is kept in the reduced-pressure atmosphere or filled with an inert gas such as a nitrogen gas to thereby complete the resonator 2.

It is also possible to configure the resonator element 1 having the pad electrodes 29a, 29b formed apart from each other in the Z'-axis direction. Also in this case, the resonator can be configured in a similar manner to the case of the resonator 2 explained with reference to FIGS. 8A and 8B. Further, it is also possible to configure the resonator element 1 having the pad electrodes 29a, 29b formed on the same surface with a certain interval. In this case, the resonator element 1 has a structure of achieving the conduction, support, and fixation by applying the electrically conductive adhesive 30 at two places (two points). Although the structure is suitable for height reduction, the mounting stress caused by the electrically conductive adhesive 30 might be a little bit stronger.

Although the example of using the laminate substrate as the package main body 40 is hereinabove explained as the resonator 2 according to the embodiment, it is also possible to configure the resonator using a single layer ceramic substrate as the package main body 40, and using a cap on which drawing is performed as the lid member.

As shown in FIGS. 8A and 8B, since the mounting stress caused by the electrically conductive adhesive 30 can be reduced by supporting the resonator element 1 at one point, and disposing the slit 17 between the thick-wall section 13 and the vibrating section 12, there is an advantage that the resonator 2 superior in frequency reproducibility, frequency-temperature characteristic, CI-temperature characteristic, and frequency-aging characteristic can be obtained.

3. Electronic Device

Then, the oscillator (the electronic device according to the embodiment of the invention) to which the resonator element according to the embodiment of the invention is applied will be explained.

Figure 9A:
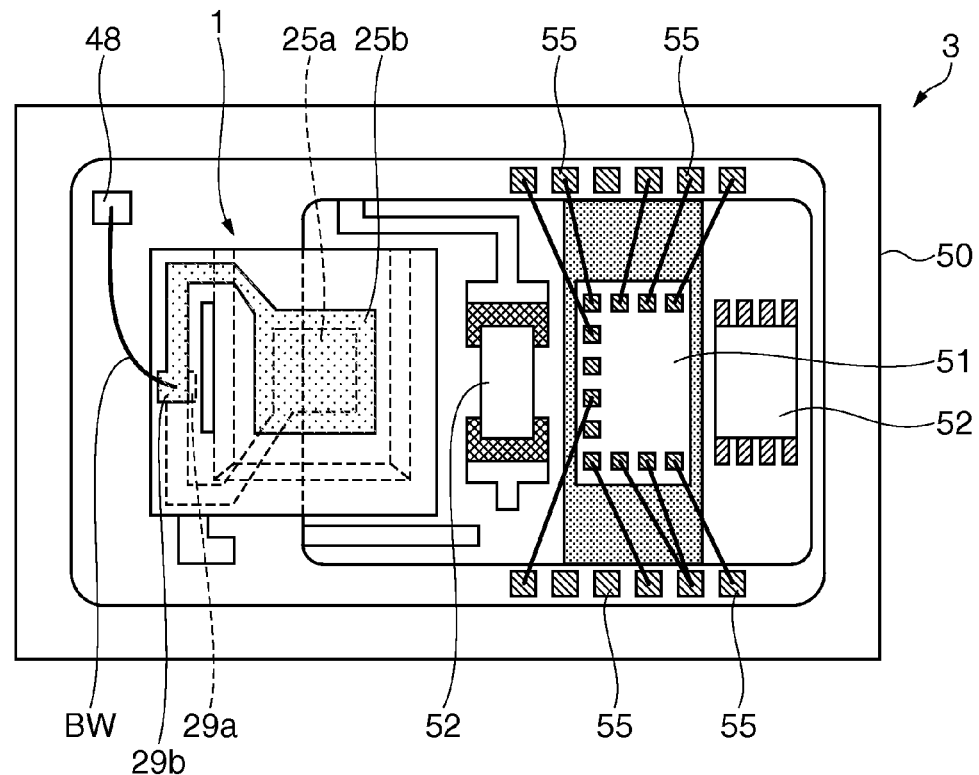
Figure 9B:
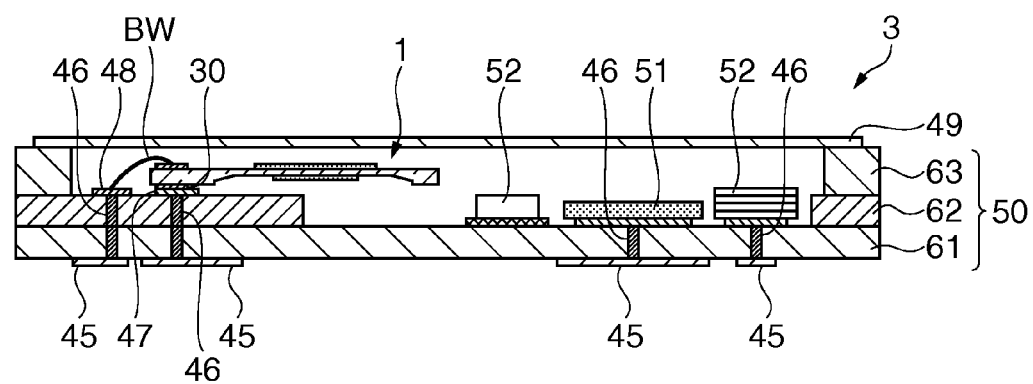

FIGS. 9A and 9B are diagrams showing a configuration of the electronic device according to the embodiment of the invention, wherein FIG. 9A is a plan view with the lid member omitted, and FIG. 9B is a vertical cross-sectional view. The electronic device 3 is provided with a package main body 50, the lid member 49, the resonator element 1, an IC component 51 equipped with the oscillator circuit for exciting the resonator element 1, and at least one of electronic components 52 including a variable capacitance element, the capacitance of which varies in accordance with an applied voltage, a thermistor, the resistance of which varies in accordance with the temperature, an inductor, and so on.

As shown in FIGS. 9A and 9B, the package main body 50 is formed by stacking a first substrate 61, a second substrate 62, and a third substrate 63 on each other. The plurality of mounting terminals 45 is formed on an exterior bottom surface of the first substrate 61. The second substrate 62 and the third substrate 63 are each formed of a ring-like member with a central portion removed.

The first substrate 61, the second substrate 62, and the third substrate 63 constitute a recessed section (a cavity) for housing the resonator element 1, the IC component 51, the electronic component 52, and so on. At predetermined positions on the upper surface of the second substrate 62, there are disposed a plurality of element mounting pads 47 having electrical conduction with the mounting terminals 45 with conductors 46. The element mounting pads 47 are arranged so as to correspond to the pad electrode 29a provided to the second thick-wall main body 15a when mounting the resonator element 1.

The pad electrode 29a of the resonator element 1 flipped is mounted on the element mounting pads 47 of the package main body 50 coated with the electrically conductive adhesive (polyimide series) 30 to thereby achieve conduction between the pad electrode 29a and the element mounting pads 47. The pad electrode 29a having appeared on the upper surface by flipping and the electrode terminal 48 of the package main body 50 are connected to each other with the bonding wire BW to thereby achieve conduction with one of the electrode terminals 55 of the IC component 51 via a conductor formed between the substrates of the package main body 50. The IC component 51 is fixed at a predetermined position of the package main body 50, and then, the terminals of the IC component 51 and the electrode terminals 55 of the package main body 50 are connected to each other with the bonding wires BW. Further, the electronic component 52 is mounted at a predetermined position of the package main body 50, and is connected to the conductors 46 with metal bumps and so on. The package main body 50 is kept in a vacuum state or filled with an inert gas such as a nitrogen gas, and then the package main body 50 is sealed with the lid member 49 to thereby complete the electronic device 3.

The method of connecting the pad electrode 29b and the electrode terminal 48 of the package main body 50 to each other with the bonding wire BW reduces the mounting stress caused by the electrically conductive adhesive 30 since the resonator element 1 is supported by one region (at one point). Further, since the resonator element 1 is flipped to set the excitation electrode 25b with a larger size to the upper side when housing the resonator element 1 in the package main body 50, the frequency adjustment of the electronic device 3 becomes easy.

By configuring the electronic device 3 as shown in FIGS. 9A and 9B, since the high-frequency resonator element 1 excited with the fundamental wave is used, there is obtained an advantage that a voltage controlled oscillator with a low capacitance ratio, a broader variable range of the frequency, and a preferable S/N ratio can be obtained.

Further, an oscillator, a temperature compensated oscillator, and so on can be configured as the electronic device 3, and there can be obtained an advantage that an oscillator superior in frequency reproducibility, aging characteristic, and frequency-temperature characteristic can be configured.

4. Electronic Apparatuses

Then, the electronic apparatuses (the electronic apparatuses according to the embodiment of the invention) to which the resonator element according to the embodiment of the invention is applied will be explained in detail with reference to FIGS. 10 through 12.

Figure 10:
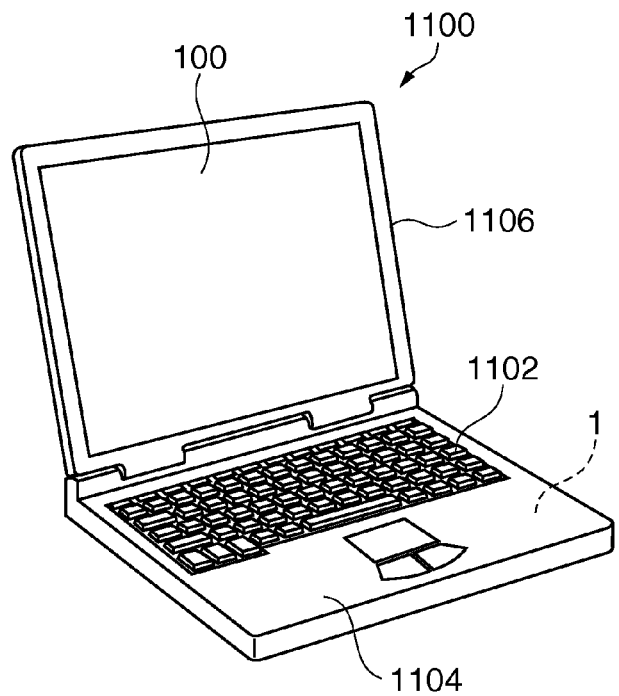
FIG. 10 is a perspective view showing a configuration of a mobile type (or laptop type) of personal computer as an example of the electronic apparatus equipped with the resonator element according to an embodiment of the invention.

FIG. 10 is a perspective view showing a configuration of a mobile type (or a laptop type) of personal computer as the electronic apparatus equipped with the resonator element according to the embodiment of the invention. In the drawing, the personal computer 1100 is composed of a main body section 1104 provided with a keyboard 1102, and a display unit 1106 provided with a display section 100, and the display unit 1106 is pivotally supported with respect to the main body section 1104 via a hinge structure. Such a personal computer 1100 incorporates the resonator element 1 functioning as a filter, a resonator, a reference clock, and so on.

Figure 11:
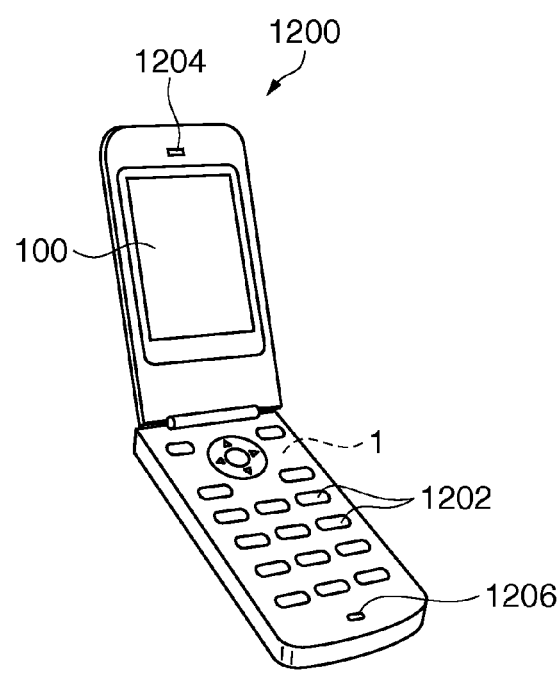
FIG. 11 is a perspective view showing a configuration of a cellular phone (including PHS) as an example of the electronic apparatus equipped with the resonator element according to an embodiment of the invention.

FIG. 11 is a perspective view showing a configuration of a cellular phone (including PHS) as the electronic apparatus equipped with the resonator element according to the embodiment of the invention. In this drawing, the cellular phone 1200 is provided with a plurality of operation buttons 1202, an ear piece 1204, and a mouthpiece 1206, and the a display section 100 is disposed between the operation buttons 1202 and the ear piece 1204. Such a cellular phone 1200 incorporates the resonator element 1 functioning as a filter, a resonator, and so on.

Figure 12:
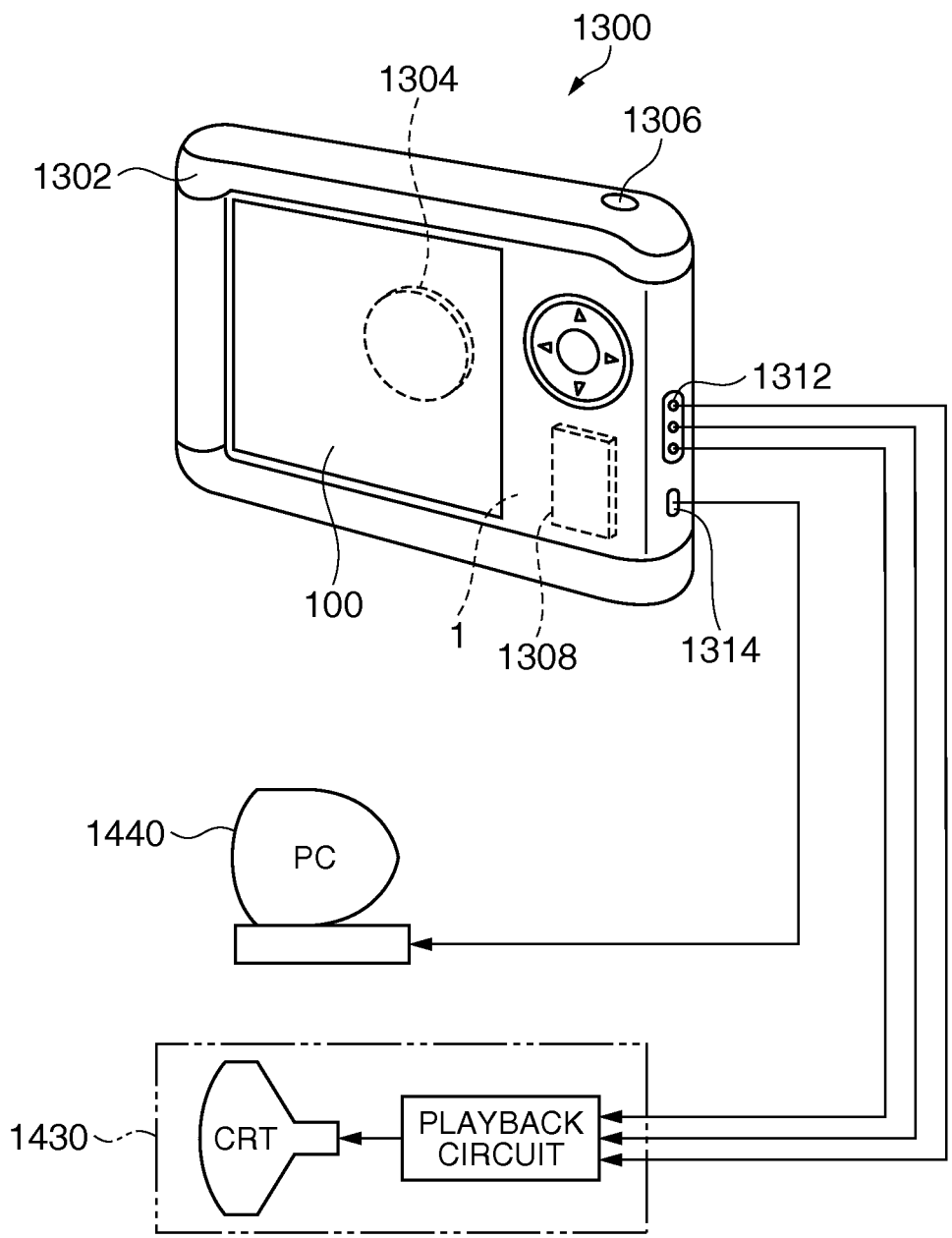
FIG. 12 is a perspective view showing a configuration of a digital still camera as an example of the electronic apparatus equipped with the resonator element according to an embodiment of the invention.

FIG. 12 is a perspective view showing a configuration of a digital still camera as the electronic apparatus equipped with the resonator element according to the embodiment of the invention. It should be noted that connection with external equipment is also shown schematically in this drawing. Here, conventional cameras expose a silver salt film to an optical image of an object, while the digital still camera 1300 performs photoelectric conversion on an optical image of an object by an imaging element such as a CCD (a charge coupled device) to generate an imaging signal (an image signal).

A case (a body) 1302 of the digital still camera 1300 is provided with a display section 100 disposed on the back surface thereof to have a configuration of performing display in accordance with the imaging signal from the CCD, wherein the display section 100 functions as a viewfinder for displaying the object as an electronic image. Further, the front surface (the back side in the drawing) of the case 1302 is provided with a light receiving unit 1304 including an optical lens (an imaging optical system), the CCD, and so on.

When the photographer confirms an object image displayed on the display section 100, and then holds down a shutter button 1306, the imaging signal from the CCD at that moment is transferred to and stored in the memory device 1308. Further, the digital still camera 1300 is provided with video signal output terminals 1312 and an input-output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 or the personal computer 1440 in accordance with a predetermined operation. Such a digital still camera 1300 incorporates the resonator element 1 functioning as a filter, a resonator, and so on.

It should be noted that, as the electronic apparatus equipped with the resonator element according to the embodiment of the invention, there can be cited, for example, an inkjet ejection device (e.g., an inkjet printer), a laptop personal computer, a television set, a video camera, a video cassette recorder, a car navigation system, a pager, a personal digital assistance (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 10, the cellular phone shown in FIG. 11, and the digital still camera shown in FIG. 12.

5. Mobile Object

Then, the mobile object (the mobile object according to the embodiment of the invention) to which the resonator element according to the embodiment of the invention is applied will be explained.

Figure 13:
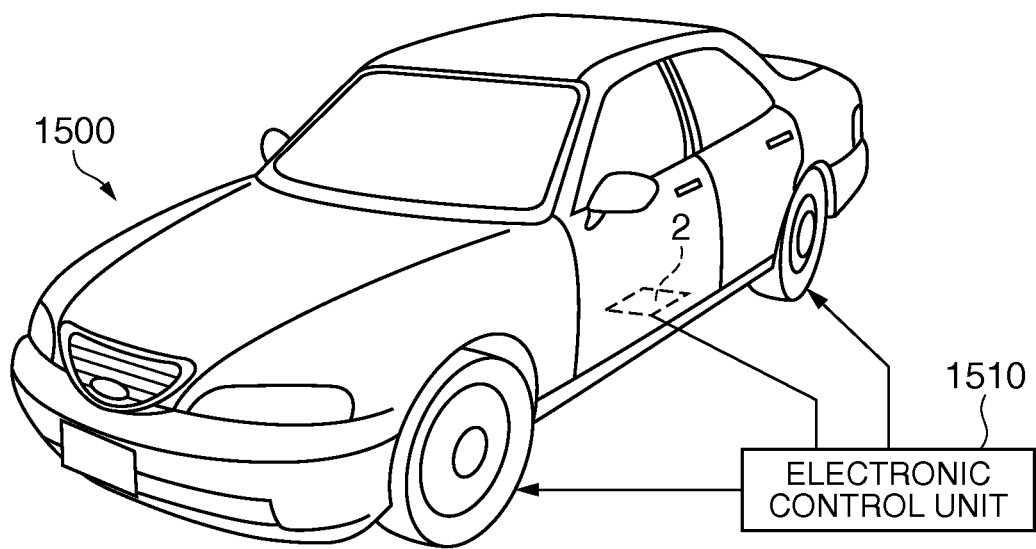
FIG. 13 is a perspective view schematically showing a vehicle as an example of the mobile object according to the invention.

FIG. 13 is a perspective view schematically showing a vehicle as an example of the mobile object according to the invention. The vehicle 1500 is equipped with the resonator 2 (or the resonator element 1). The resonator 2 can widely be applied to an electronic control unit (ECU) 1510 such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle posture control system.

Although the resonator element, the resonator, the oscillator, the electronic apparatus, and the mobile object according to the embodiment of the invention are hereinabove explained based on the embodiments shown in the accompanying drawings, the invention is not limited thereto, but the configuration of each of the constituents can be replaced with one having an arbitrary configuration with an equivalent function. Further, it is possible to add any other constituents to the invention. Further, it is also possible to arbitrarily combine any of the embodiments.

The entire disclosure of Japanese Patent Application No. 2012-070896, filed Mar. 27, 2012 and Japanese Patent Application No. 2013-022030, filed Feb. 7, 2013 are expressly incorporated by reference herein.

What is claimed is:

1. A resonator element comprising:
a substrate including a first principal surface and a second principal surface respectively forming an obverse surface and a reverse surface of the substrate, and vibrating in a thickness-shear vibration mode;
a first excitation electrode disposed on the first principal surface; and
a second excitation electrode disposed on the second principal surface, and being larger than the first excitation electrode in a plan view,
wherein the first excitation electrode fits into an outer edge of the second excitation electrode in the plan view, and the following relational expressions are fulfilled:

$$M = K \times (hx/2 \times ts) \times \sqrt{\Delta}$$

$$\Delta = (fs - fe)/fs$$

$$fs = R/[ts + te2 \times (\rho e/\rho x)]$$

$$fe = R/[ts + te \times (\rho e/\rho x)]$$

$$15.5 \leq M \leq 36.7$$

where:
M denotes an energy trap coefficient;
K denotes an anisotropy factor of the substrate;
hx denotes a length of the first excitation electrode along a thickness-shear vibration direction;
ts denotes a thickness of the substrate;
$\Delta$ denotes an amount of frequency drop;
fs denotes a cut-off frequency of the substrate;
fe denotes a frequency when the excitation electrodes are disposed on the substrate;
R denotes a frequency constant of the substrate;
te denotes a sum of a thickness of the first excitation electrode and a thickness of the second excitation electrode;
te2 denotes the thickness of the second excitation electrode;
$\rho e$ denotes a density of the excitation electrodes; and
$\rho x$ denotes a density of the substrate.

2. The resonator element according to claim 1, wherein the following relational expression is fulfilled:

$$17.1 \leq M \leq 35.7.$$

3. The resonator element according to claim 1, wherein assuming that hz denotes a length of the first excitation electrode along a direction perpendicular to the thickness-shear vibration direction, the following relational expression is fulfilled:

$$1.25 \leq hx/hz \leq 1.31.$$

4. The resonator element according to claim 1, wherein the substrate is a quartz crystal substrate.

5. The resonator element according to claim 4, wherein the quartz crystal substrate is an AT-cut quartz crystal substrate.

6. A resonator comprising:
the resonator element according to claim 1; and
a package adapted to house the resonator element.

7. A resonator comprising:
the resonator element according to claim 2; and
a package adapted to house the resonator element.

8. An electronic device comprising:
resonator element according to claim 1; and
an oscillator circuit adapted to drive the resonator element.

9. An electronic device comprising:
resonator element according to claim 2; and
an oscillator circuit adapted to drive the resonator element.

10. An electronic apparatus comprising:
resonator element according to claim 1.

11. An electronic apparatus comprising:
resonator element according to claim 2.

12. A mobile object comprising:
resonator element according to claim 1.

13. A mobile object comprising:
resonator element according to claim 2.

* * * * *